US009407283B2

United States Patent
Caldwell et al.

(10) Patent No.: US 9,407,283 B2
(45) Date of Patent: Aug. 2, 2016

(54) DELTA-SIGMA MODULATOR HAVING SENSOR FRONT-END

(71) Applicant: ANALOG DEVICES TECHNOLOGY, Hamilton (BM)

(72) Inventors: Trevor Clifford Caldwell, Toronto (CA); Richard E. Schreier, Toronto (CA)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/055,980

(22) Filed: Oct. 17, 2013

(65) Prior Publication Data

US 2015/0109157 A1  Apr. 23, 2015

(51) Int. Cl.
| | |
|---|---|
| *H03M 3/00* | (2006.01) |
| *G01R 19/25* | (2006.01) |
| *H03M 1/12* | (2006.01) |
| *H03M 1/00* | (2006.01) |

(52) U.S. Cl.
CPC .............. *H03M 3/458* (2013.01); *G01R 19/25* (2013.01); *H03M 1/00* (2013.01); *H03M 1/12* (2013.01); *H03M 3/30* (2013.01)

(58) Field of Classification Search
CPC ............ H03M 3/30; H03M 1/12; H03M 1/00
USPC ........................... 341/143, 155, 156, 136, 120
See application file for complete search history.

(56) References Cited

U.S. PATENT DOCUMENTS

| | | | | |
|---|---|---|---|---|
| 6,529,127 | B2* | 3/2003 | Townsend et al. ............ | 340/505 |
| 6,911,928 | B2 | 6/2005 | Orsier et al. | |
| 7,358,880 | B1* | 4/2008 | Melanson ..................... | 341/143 |
| 7,561,085 | B2* | 7/2009 | Newlin et al. ................. | 341/131 |
| 7,994,770 | B2* | 8/2011 | Royle et al. ..................... | 324/67 |
| 8,660,410 | B2* | 2/2014 | Barton et al. ................. | 386/291 |
| 2004/0169437 | A1 | 9/2004 | Orsier et al. | |
| 2008/0252500 | A1* | 10/2008 | Strandjord et al. ........... | 341/143 |
| 2009/0007661 | A1* | 1/2009 | Nasiri et al. ............... | 73/504.03 |
| 2012/0297888 | A1* | 11/2012 | Nagarajan et al. ............. | 73/774 |
| 2013/0207479 | A1* | 8/2013 | Vendik et al. ................. | 307/104 |

OTHER PUBLICATIONS

Vishal Saxena et al., "Design and Fabrication of a MEMS Capacitive Chemical Sensor System," © 2006 IEEE, 1-4244-0374-X/06, 2 pages.

(Continued)

*Primary Examiner* — Joseph Lauture
(74) *Attorney, Agent, or Firm* — Patent Capital Group (57) ABSTRACT

A delta-sigma modulator is configured to sense and convert an electromagnetic field into a digital signal. An exemplary delta-sigma modulator includes a sensor component, such as an LC resonator, that is configured to sense the electromagnetic field and generate an input analog signal, where the delta-sigma modulator is configured to convert the input analog signal to the digital signal. Delta-sigma modulator can include an analog-to-digital converter coupled to the sensor component that receives and converts the input analog signal to the digital signal. Delta-sigma modulator can further include a digital-to-analog converter (DAC) coupled to the resonator and the ADC, the DAC configured to receive the digital signal from the ADC and generate a feedback analog signal.

20 Claims, 2 Drawing Sheets

(56) References Cited

OTHER PUBLICATIONS

Dong-Yong Shin et al., "A Delta-Sigma Interface Circuit for Capacitive Sensors with an Automatically Calibrated Zero Point," IEEE Transactions on Circuits and Systems—II: Express Briefs, vol. 58, No. 2, Feb. 2011, pp. 90-94.

Zhichao Tan et al., "A 1.8V 11μW CMOS Smart Humidity Sensor for RFID Sensing Applications," IEEE Asian Solid-State Circuits Conference, Nov. 14-16, 2011, 978-1-4577-1785-7/11 © 2011 IEEE, pp. 105-108.

* cited by examiner

DELTA-SIGMA MODULATOR HAVING SENSOR FRONT-END

TECHNICAL FIELD

The present disclosure relates generally to delta-sigma modulators, and more particularly, to delta-sigma modulators configured as sensors.

BACKGROUND

A delta-sigma (ΔΣ) modulator is a feedback system that can achieve high-resolution digital signals. The delta-sigma modulator has been implemented in a wide variety of electronic circuits, including but not limited to, analog-to-digital converters (ADCs), digital-to-analog converters (DACs), frequency synthesizers, and other electronic circuits. In receiver applications, the delta-sigma modulator can be implemented to receive an analog signal and convert the analog signal to a digital signal. Typically, the analog signal is conditioned (for example, by amplifying and/or filtering) by other receiver circuitry (such as a sensor interface circuit) before it is received by the delta-sigma modulator for digitization. Although such configurations have been generally adequate for their intended purposes, they have not been entirely satisfactory in all respects.

BRIEF DESCRIPTION OF DRAWINGS

The present disclosure is best understood from the following detailed description when read with the accompanying figures. It is emphasized that, in accordance with the standard practice in the industry, various features are not drawn to scale and are used for illustration purposes only. In fact, the dimension of the various features may be arbitrarily increased or reduced for clarity of discussion.

OVERVIEW OF EXAMPLE EMBODIMENTS

A delta-sigma modulator for sensing and converting an electromagnetic field into a digital signal is described herein. For example, the delta-sigma modulator includes a sensor component that is configured to sense the electromagnetic field and generate an input signal for digitization. In various implementations, the sensor component includes an LC resonator configured to sense the electromagnetic field and generate an input analog signal, where the delta-sigma modulator is configured to convert the input analog signal to the digital signal. Delta-sigma modulator can further include an analog-to-digital converter coupled to the sensor component that receives and converts the input analog signal to the digital signal. Delta-sigma modulator can further include a digital-to-analog converter (DAC) coupled to the LC resonator and the ADC, the DAC configured to receive the digital signal from the ADC and generate a feedback analog signal. In various implementations, an inductor of the LC resonator is configured to sense a magnetic field, such that a current induced by the sensed magnetic field provides the input analog signal. In various implementations, a capacitor of the LC resonator is configured to sense an electric field, such that a voltage induced by the sensed electric field provides the analog signal.

A delta-sigma analog-to-digital converter that can implement the delta-sigma modulator is also described herein. The delta-sigma analog-to-digital converter can include the delta-sigma modulator coupled to a digital filter/decimator component. The digital filter/decimator component can process the digital signal (representing the input signal generated by the sensor component of the delta-sigma modulator). In various implementations, the delta-sigma analog-to-digital converter can be implemented in a receiver. The receiver can further include a digital signal processor that receives the processed digital signal from the delta-sigma analog-to-digital converter for subsequent processing.

DETAILED DESCRIPTION OF EXAMPLE EMBODIMENTS

Figure 1:
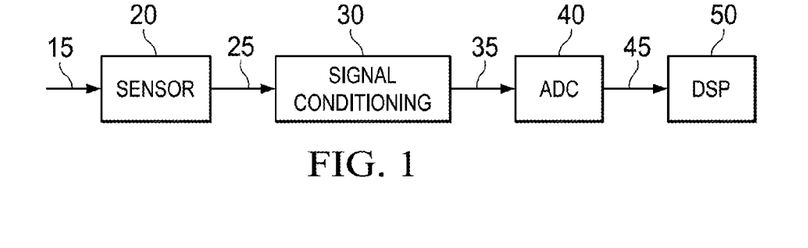
FIG. 1 is a schematic block diagram of an exemplary receiver according to various aspects of the present disclosure.

FIG. 1 is a schematic block diagram of an exemplary receiver 10 according to various aspects of the present disclosure. The receiver 10 is an electronic device (including an electronic circuit and/or one or more components) configured to receive and convert signals into a usable form. In the depicted embodiment, receiver 10 converts physical conditions into a digital form, which can be stored and/or analyzed. In various implementations, receiver 10 can be referred to as a sensor system. In FIG. 1, receiver 10 receives an input signal 15 that represents a physical quantity. For example, in various implementations, input signal 15 is an electromagnetic field, which can include an electric field, a magnetic field, or a combination thereof. A sensor circuit block 20 receives the input signal 15 and converts the physical quantity (represented by the input signal 15) into an electrical signal, such as an analog signal 25. The analog signal 25 can be a voltage or current that represents the physical quantity. A signal conditioning circuit block 30 (also referred to as a sensor interface or a sensor interface circuit) receives and adjusts the analog signal 25 within an acceptable range of an analog-to-digital converter (ADC), thereby providing conditioned analog signal 35. The ADC can be provided at ADC circuit block 40, such that signal conditioning circuit block 30 acts as an interface between sensor circuit block 20 and ADC circuit block 40, conditioning analog signal 25 (and thereby providing conditioned analog signal 35) before ADC circuit block 40 digitizes the analog signal. Signal conditioning circuit block 30 can amplify, attenuate, filter, and/or perform other conditioning functions to the analog signal 25. ADC circuit block 40 receives and converts the conditioned analog signal 35 into digital form, thereby providing digital signal 45. The digital signal 45 represents the physical quantity received by the sensor via incoming signal 15 (in various implementations, an electromagnetic field). A digital signal processor (DSP) circuit block 50 can receive and process the digital signal 45. FIG. 1 has been simplified for the sake of clarity to better understand the inventive concepts of the present disclosure. Additional features can be added in receiver 10, and some of the features described can be replaced or eliminated in other embodiments of receiver 10.

Figure 2:
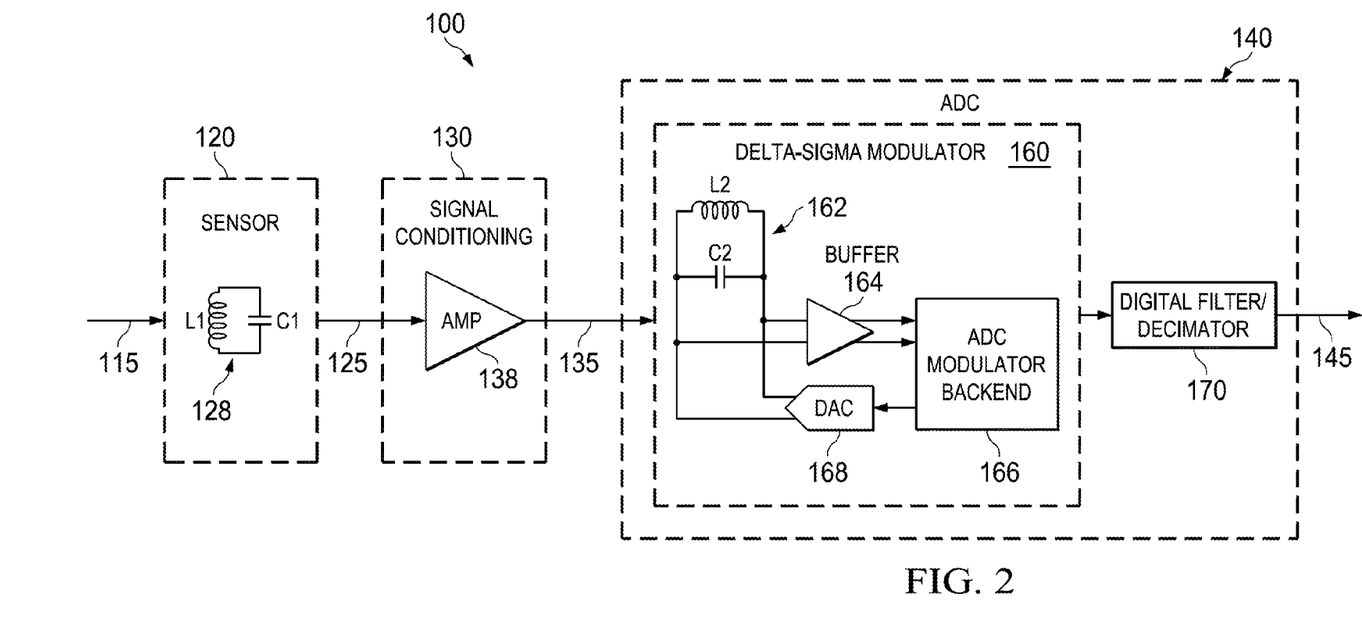
FIG. 2 is a schematic block diagram of another exemplary receiver according to various aspects of the present disclosure.

FIG. 2 is a schematic block diagram of another exemplary receiver 100 according to various aspects of the present disclosure. The receiver 100 is an electronic device (including an electronic circuit and/or one or more components) configured to receive and convert signals into a usable form. In the depicted embodiment, receiver 100 converts physical conditions into a digital form, which can be stored and/or analyzed. In FIG. 2, receiver 100 receives an input signal 115 that represents a physical quantity and converts input signal 115 into digital form, as described below. In various implementations, input signal 115 is an electromagnetic field (which can include an electric field, a magnetic field, or a combination thereof), and receiver 100 converts the electromagnetic signal into a digital signal. In various implementations, receiver 10 can be referred to as a sensor system. FIG. 2 has been simplified for the sake of clarity to better understand the inventive concepts of the present disclosure. Additional features can be added in receiver 100, and some of the features described can be replaced or eliminated in other embodiments of receiver 100.

A sensor circuit block 120 receives the input signal 115 that represents the physical quantity. Sensor circuit block 120 converts the physical quantity into an electrical signal, such as an analog signal 125. The analog signal 125 can be a voltage or current that represents the physical quantity. In the depicted embodiment, sensor circuit block 120 can include a sensor component 128 configured to sense and convert input signal 115, thereby providing the analog signal 125. In various implementations, where input signal is an electromagnetic field, sensor component 128 can sense an electric field, a magnetic field, or a combination thereof, and convert the sensed field into analog signal 125. For example, sensor component 128 can include an LC (inductor-capacitor) resonator that includes an inductor L1 and a capacitor C1. The LC resonator can be configured as a capacitive sensor or an inductive sensor that generates analog signal 125 (such as a voltage or a current) upon sensing input signal 115.

A signal conditioning circuit block 130 (also referred to as a sensor interface or sensor interface circuit) receives and adjusts the analog signal 125 within an acceptable range of an analog-to-digital converter, thereby providing conditioned analog signal 135. Signal conditioning circuit block 130 can amplify, attenuate, filter, and/or perform other conditioning functions to the analog signal 125. In the depicted embodiment, signal conditioning circuit block 130 includes an amplifier 138 that can increase amplitude of analog signal 125 to within a range that can effectively be processed by an analog-to-digital converter. In various implementations, amplifier 138 can be an operational amplifier or a programmable gain amplifier.

An analog-to-digital converter (ADC) circuit block 140 receives and converts the conditioned analog signal 135 into digital form, thereby providing digital signal 145. In the depicted embodiment, signal conditioning circuit block 130 acts as an interface between sensor circuit block 120 and ADC circuit block 140, conditioning the analog signal (provided by sensor circuit block 120) before ADC circuit block 140 digitizes the analog signal. For example, amplifier 138 generates conditioned analog signal 135 (by amplifying analog signal 125) within a range that an ADC (included in ADC circuit block 140) can effectively digitize to provide a digital signal that represents the input signal 115 received by sensor circuit block 120.

In the depicted embodiment, ADC circuit block 140 includes a delta-sigma ($\Delta\Sigma$) ADC that generates a digital signal using a feedback technique, where delta-sigma ADC can oversample its input signal (here, conditioned analog signal 135) and perform noise-shaping to achieve a high-resolution digital signal (here, digital signal 145). In various implementations, delta-sigma ADC measures a difference between conditioned analog signal 135 and a feedback signal, such as that provided by a delta-sigma modulator of delta-sigma ADC.

Delta-sigma ADC can include a delta-sigma modulator 160. Delta-sigma modulator 160 can use oversampling (for example, a sampling rate above Nyquist rate) and filtering to generate a digital signal representing the input signal received by the delta-sigma ADC (here, conditioned analog signal 135). In the depicted embodiment, delta-sigma modulator 160 includes a filter 162, a buffer 164, an analog-to-digital converter (ADC) modulator backend 166 (which can include an analog-to-digital converter (also referred to as a quantizer)), and a digital-to-analog converter (DAC) 168. In various implementations, delta-sigma modulator 160 includes a feed forward path that includes filter 162, buffer 164, and the ADC modulator backend 166; and a feedback path that includes DAC 168.

Filter 162 can remove noise from conditioned analog signal 135. In various implementations, filter 162 includes a low pass filter, a band-pass filter, or a combination thereof. In the depicted embodiment, filter 162 is a band-pass filter that allows signals within a frequency range to pass through to ADC modulator backend 166, while preventing signals outside the frequency range from passing through to ADC modulator backend 166. Delta-sigma modulator 160 can thus be referred to as a band-pass delta-sigma modulator. The band-pass filter can optimize signal-to-noise ratio of receiver 100. For example, by implementing the band-pass filter, delta-sigma modulator 160 can move quantization noise up and down in frequency to achieve a virtually noise-free region in the pass band. In various implementations, filter 162 includes an LC resonator that includes an inductor L2 and a capacitor C2.

Buffer 164 (also referred to as a buffer amplifier) is coupled to filter 162 and ADC backend modulator 166. Buffer 164 provides an interface between filter 162 and ADC modulator backend 166, such that delta-sigma modulator 160 can sufficiently drive an ADC of ADC modulator backend 166 with conditioned analog signal 135 (after processing by filter 162). Buffer 164 can transform electrical impedance from filter 162 to ADC modulator backend 166. In various implementations, buffer 164 is a unity gain amplifier.

ADC modulator backend 166 includes an analog-to-digital converter (also referred to as a quanitzer) that digitizes conditioned analog signal 135, as noted above. In the depicted embodiment, the analog-to-digital converter receives an analog signal (conditioned analog signal 135 after processing by filter 162 and buffer 164) and converts the analog signal to a digital signal. ADC modulator backend 166 can include various components for converting the analog signal to the digital signal, including but not limited to, analog-to-digital converters, digital-to-analog converters, integrators, resonators, filtering components, etc.

DAC 168 is coupled to filter 162 and ADC modulator backend 166. DAC 168 receives a digital signal from ADC modulator backend 166 and converts the digital signal to an analog feedback signal, which is received by filter 162 (and/or buffer 164). The analog feedback signal and the input signal, such as conditioned analog signal 135 combine to drive filter 162. In various implementations, delta-sigma modulator 160 generates a driving signal for filter 162 that represents a difference between analog feedback signal and input signal.

Delta-sigma ADC can further include a digital filter/decimator 170. Digital filter/decimator 170 can attenuate noise and/or slow a data rate (for example, to a Nyquist sampling rate) of the digital signal, thereby providing digital signal 145. In various implementations, the digital filter/decimator includes a digital filter, a decimator, or both. The digital filter can attenuate the digital signal received from the delta-sigma modulator 160, and the decimator can reduce a sampling rate of the digital signal received from the delta-sigma modulator 160. In various implementations, receiver 100 can further include a digital signal processor (not depicted) that receives and processes the digital signal 145.

Figure 3:
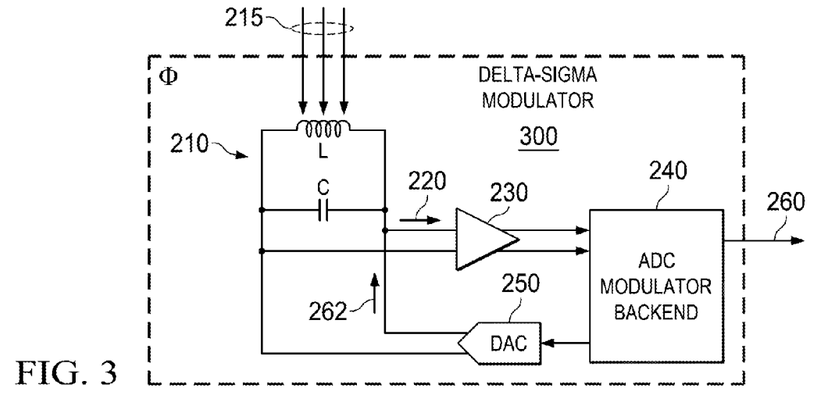
FIG. 3 is a schematic block diagram of an exemplary delta-sigma modulator according to various aspects of the present disclosure.

FIG. 3 is a schematic block diagram of an exemplary delta-sigma modulator 200 according to various aspects of the present disclosure. Delta-sigma modulator 200 is an electronic device (including an electronic circuit and/or one or more components) configured to convert signals (such as analog signals) into a digital form. In the depicted embodiment, delta-sigma modulator 200 can convert physical conditions into digital form, which can be stored and/or analyzed. In various implementations, delta-sigma modulator 200 is a band-pass delta-sigma modulator. FIG. 3 has been simplified for the sake of clarity to better understand the inventive concepts of the present disclosure. Additional features can be added in delta-sigma modulator 200, and some of the features described can be replaced or eliminated in other embodiments of delta-sigma modulator 200.

Delta-sigma modulator 200 is configured to sense and convert an input signal 215 (a physical quantity) and converts input signal 215 into digital form. In various implementations, input signal 215 is an electromagnetic field (which can include an electric field, a magnetic field, or a combination thereof), and delta-sigma modulator 200 converts the electromagnetic field into a digital signal. More specifically, delta-sigma modulator 200 includes a sensor component 210 that senses the input signal 215 to generate an electrical input signal for digitization by delta-sigma modulator 200. In the depicted embodiment, sensor component 210 includes an LC resonator that includes an inductor L and a capacitor C connected in parallel. The LC resonator can be configured to resonate at a desired frequency. In various implementations, LC resonator is configured as an inductive sensor, such that LC resonator senses a magnetic field ($\phi$) (a detected, measured physical quantity represented by input signal 215) and generates an analog signal 220 for delta-sigma modulator 200. For example, a current induced by the sensed magnetic field can provide the analog signal 220. The inductor L can thus be referred to as a magnetic field sensor. In various implementations, delta-sigma modulator 200 can include multiple resonators, where the LC resonator configured as the sensor component is a first stage resonator of the multiple resonators, and the other resonators are configured as filters, such as band-pass filters as described herein.

The analog signal 220 becomes an input signal for digitization by delta-sigma modulator 200. Delta-sigma modulator 200 is thus configured to directly convert a physical quantity, such as the electromagnetic field (depicted as input signal 215), into a digital signal without additional interfaces circuits. Put another way, delta-sigma modulator 200 generates its own electrical input signal (analog signal 220) representing the electromagnetic field, such that delta-sigma modulator 200 can provide a digital representation of the electromagnetic field (input signal 215) without receiving an electrical input signal representing the electromagnetic field from a separate input terminal—for example, such as described above, where delta sigma modulator 160 coupled with other receiver circuit blocks, such as sensor circuit block 120 and/or signal conditioning circuit block 130, receives its analog signal for digitization (analog signal 135) from the signal conditioning circuit block 130.

Delta-sigma modulator 200 can use oversampling (for example, a sampling rate above Nyquist rate) and filtering to generate a digital signal representing the analog signal 220 generated by delta-sigma modulator 200. In the depicted embodiment, delta-sigma modulator 200 further includes a buffer 230, an analog-to-digital converter (ADC) modulator backend 240, and a digital-to-analog converter (DAC) 250. Sensor component 210, buffer 230, and ADC modulator backend 240 can form a feed forward path of delta-sigma modulator 200; and DAC 250 can form a feedback path of delta-sigma modulator 200.

Buffer 230 (also referred to as a buffer amplifier) is coupled to sensor component 210 and ADC modulator backend 240. Buffer 230 provides an interface between sensor component 210 and ADC modulator backend 240, such that delta-sigma modulator 200 can sufficiently drive ADC modulator backend 240 with analog signal 220. Buffer 230 can transform electrical impedance from sensor component 210 to ADC modulator backend 240. In various implementations, buffer 230 is a unity gain amplifier. In various implementations, buffer 230 is omitted from delta-sigma modulator 200, such that ADC modulator backend 240 directly receives analog signal 220 from sensor component 210.

ADC modulator backend 240 digitizes analog signal 220. ADC modulator backend 240 can include various components for converting analog signal 220 to digital signal 260, including but not limited to, analog-to-digital converters, digital-to-analog converters, integrators, resonators, filtering components, and/or other components. In various implementations, ADC modulator backend 240 includes an analog-to-digital converter (also referred to as a quanitzer) that digitizes analog signal 220. In the depicted embodiment, ADC modulator backend 240 receives analog signal 220 (after processing by buffer 230) and converts analog signal 220 to a digital signal 260, which is a digital representation of analog signal 220, and accordingly, a digital representation of the magnetic field (depicted as input signal 215) sensed by delta-sigma modulator 200.

DAC 250, which is coupled to sensor component 210 and ADC modulator backend 240, receives a digital signal (such as digital signal 260) from ADC modulator backend 240 and converts the digital signal back to an analog signal, thereby generating analog feedback signal 262. The analog feedback signal 262 and input signal generated by delta-sigma modulator 200 (here, analog signal 220) can combine to drive sensor component 210. In various implementations, delta-sigma modulator 200 generates a driving signal for sensor component 210 that represents a difference between analog feedback signal 262 and analog signal 220.

Figure 4:
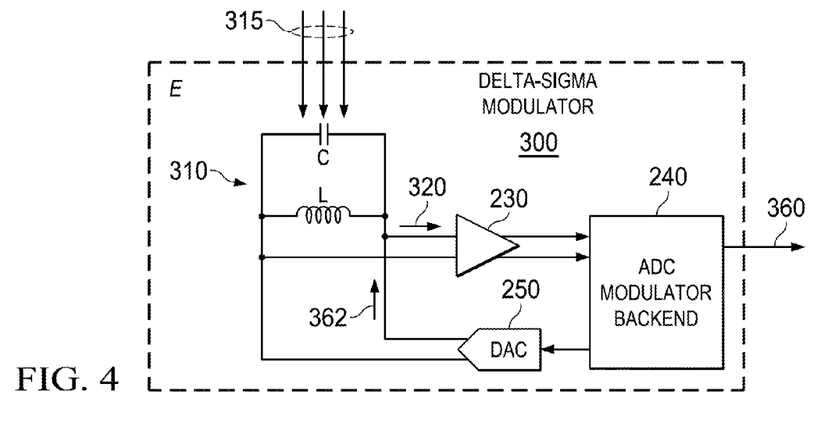
FIG. 4 is a schematic block diagram of another exemplary delta-sigma modulator according to various aspects of the present disclosure.

FIG. 4 is a simplified block diagram of another exemplary delta-sigma modulator 300 according to various aspects of the present disclosure. Delta-sigma modulator 300 is an electronic device (including an electronic circuit and/or one or more components) configured to convert signals (such as analog signals) into a digital form. In the depicted embodiment, delta-sigma modulator 300 can convert physical conditions into digital form, which can be stored and/or analyzed. In various implementations, delta-sigma modulator 300 is a band-pass delta-sigma modulator. The embodiment of FIG. 4 is similar in many respects to the embodiment of FIG. 3. Accordingly, similar features in FIG. 3 and FIG. 4 are identified by the same reference numerals for clarity and simplicity. FIG. 4 has been simplified for the sake of clarity to better understand the inventive concepts of the present disclosure.

Additional features can be added in delta-sigma modulator 300, and some of the features described below can be replaced or eliminated in other embodiments of delta-sigma modulator 300.

Similar to delta-sigma modulator 200, delta-sigma modulator 300 is configured to sense and convert an input signal 315 (a physical quantity) and converts input signal 315 into digital form. In various implementations, input signal 315 is an electromagnetic field (which can include an electric field, a magnetic field, or a combination thereof), and delta-sigma modulator 300 converts the electromagnetic field into a digital signal. More specifically, delta-sigma modulator 300 includes a sensor component 310 that senses the input signal 315 to generate an electrical input signal for digitization by delta-sigma modulator 300. In the depicted embodiment, sensor component 310 includes an LC resonator that includes an inductor L and a capacitor C connected in parallel. The LC resonator can be configured to resonate at a desired frequency. In contrast to delta-sigma modulator 200, in various implementations of delta-sigma modulator 300, LC resonator is configured as a capacitive sensor, such that LC resonator senses an electric field (E) (a detected, measured physical quantity represented by input signal 315) and generates an analog signal 320 for delta-sigma modulator 300. For example, a voltage induced by the sensed electric field can provide the analog signal 320. The capacitor C can thus be referred to as an electric field sensor. In various implementations, delta-sigma modulator 300 can include multiple resonators, where the LC resonator configured as the sensor component is a first stage resonator of the multiple resonators, and the other resonators are configured as filters, such as bandpass filters as described herein.

The analog signal 320 becomes an input signal for digitization by delta-sigma modulator 300. Delta-sigma modulator 300 is thus configured to directly convert a physical quantity, such as the electromagnetic field (depicted as input signal 315), into a digital signal without additional interfaces circuits. Put another way, delta-sigma modulator 300 generates its own electrical input signal (analog signal 320) representing the electromagnetic field, such that delta-sigma modulator 300 can provide a digital representation of the electromagnetic field (input signal 315) without receiving an electrical input signal representing the electromagnetic field from a separate input terminal—for example, such as described above, where delta sigma modulator 160 coupled with other receiver circuit blocks, such as sensor circuit block 120 and/or signal conditioning circuit block 130, receives its analog signal for digitization (analog signal 135) from the signal conditioning circuit block 130.

Similar to delta-sigma modulator 200, delta-sigma modulator 300 can use oversampling (for example, a sampling rate above Nyquist rate) and filtering to generate a digital signal representing the analog signal generated by delta-sigma modulator 300 (here, analog signal 320). In the depicted embodiment, delta-sigma modulator 300 also further includes buffer 230, ADC modulator backend 240, and DAC 250, where a feed forward path of delta-sigma modulator 300 can include sensor component 310, buffer 230, and ADC modulator backend 240 and a feedback path of delta-sigma modulator 300 can include DAC 250.

Similar to delta-sigma modulator 200, in delta-sigma modulator 300, buffer 230 is coupled to sensor component 310 and ADC modulator backend 240. Buffer 230 provides an interface between sensor component 310 and ADC modulator backend 240, such that delta-sigma modulator 300 can sufficiently drive ADC modulator backend 240 with analog signal 320. Buffer 230 can transform electrical impedance from sensor component 310 to ADC modulator backend 240. In various implementations, buffer 230 can be omitted from delta-sigma modulator 300, such that ADC modulator backend 240 directly receives analog signal 320 from sensor component 310.

Similar to delta-sigma modulator 200, in delta-sigma modulator 300, ADC modulator backend 240 digitizes analog signal 320. ADC modulator backend 240 can include various components for converting analog signal 320 to digital signal 360, including but not limited to, analog-to-digital converters, digital-to-analog converters, integrators, resonators, filtering components, and other components. In various implementations, ADC modulator backend 240 includes an analog-to-digital converter (also referred to as a quanitzer) that digitizes analog signal 320. In the depicted embodiment, ADC modulator backend 240 receives analog signal 320 (after processing by buffer 230) and converts analog signal 320 to a digital signal 360, which is a digital representation of analog signal 320, and accordingly, a digital representation of the electric field (depicted as input signal 315) sensed by delta-sigma modulator 300.

Similar to delta-sigma modulator 200, in delta-sigma modulator 300, DAC 250, which is coupled to sensor component 310 and ADC modulator backend 240, receives a digital signal (such as digital signal 360) from ADC modulator backend 240 and converts the digital signal back to an analog signal, thereby generating analog feedback signal 362. The analog feedback signal 362 and input signal generated by delta-sigma modulator 300 (here, analog signal 320) can combine to drive sensor component 310. In various implementations, delta-sigma modulator 300 generates a driving signal for sensor component 310 that represents a difference between analog feedback signal 362 and analog signal 320.

Figure 5:
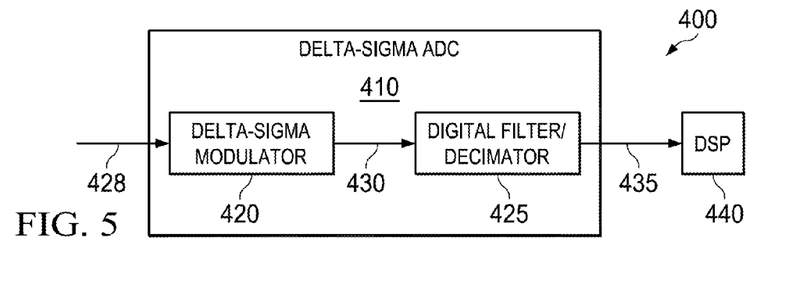
FIG. 5 is a schematic block diagram of an exemplary receiver that implements a delta-sigma modulator, such as that of FIG. 3 or FIG. 4, according to various aspects of the present disclosure.

FIG. 5 is a schematic block diagram of an exemplary receiver 400 that implements a delta-sigma modulator, such as that of FIG. 3 or FIG. 4, according to various aspects of the present disclosure. The receiver 400 is an electronic device (including an electronic circuit and/or one or more components) configured to receive and convert signals into a usable form. In the depicted embodiment, receiver 400 converts physical conditions into a digital form, which can be stored and/or analyzed. In various implementations, receiver 400 can be referred to as a sensor system. FIG. 5 has been simplified for the sake of clarity to better understand the inventive concepts of the present disclosure. Additional features can be added in receiver 400, and some of the features described can be replaced or eliminated in other embodiments of receiver 400.

Receiver 400 includes a delta-sigma analog-to-digital converter (ADC) 410 that includes a delta-sigma modulator 420 and a digital filter/decimator 425. Delta-sigma modulator 420 is configured as delta-sigma modulator 200 of FIG. 3 or delta-sigma modulator 300 of FIG. 4, described above. For example, delta-sigma modulator 420 senses a physical quantity (depicted as input signal 428), such as an electromagnetic field, generates its input electrical signal (an analog signal), and converts the input electrical signal into a digital signal 430, thereby directly converting the sensed physical quantity (input signal 428) into the digital signal 430. Delta-sigma modulator 420 can use oversampling (for example, a sampling rate above Nyquist rate) and filtering to generate the digital signal 430.

Digital filter/decimator 425 receives and processes digital signal 430, thereby providing digital signal 435. Digital filter/decimator 425 can attenuate noise and/or slow a data rate (for example, to a Nyquist sampling rate) of digital signal 430. In various implementations, the digital filter/decimator includes a digital filter, a decimator, or both. The digital filter can attenuate digital signal 430, and the decimator can reduce a sampling rate of digital signal 430. In various implementations, receiver 400 can further include a digital signal processor (DSP) 440 that receives and processes digital signal 435.

Delta-sigma modulator 420 (configured as delta-sigma modulator 200 of FIG. 3 or delta-sigma modulator 300 of FIG. 4) significantly reduces receiver circuitry, resulting in receiver 400 having reduced area, reduced noise, and/or reduced power when compared to typical receiver configurations (such as that associated with receiver 100 and receiver 200). By implementing a delta-sigma modulator that can sense the electromagnetic field and convert the electromagnetic field into the digital signal, delta-sigma modulator 420 seamlessly integrates sensor circuit block, signal conditioning circuit block (alternatively referred to as a sensor interface circuit), and ADC circuit block functions, such that sensor circuit block and signal conditioning circuit block can be eliminated from the receiver circuitry chain, significantly simplifying the receiver circuitry chain. In various implementations, delta-sigma modulator 420 directly converts the electromagnetic field into the digital signal without a sensor interface circuit between sensing and digitization operations. Different embodiments may have different advantages, and no particular advantage is necessarily required of any of the embodiments described herein.

In various implementations, receivers (for example, receiver 10, receiver 100, and receiver 400) and delta-sigma modulators (for example, delta-sigma modulator 200 and delta-sigma modulator 300), and/or the various circuits and/or components of the FIGURES can be implemented on a board of an associated electronic device. The board can be a general circuit board that can hold various components of an internal electronic system of the electronic device and, further, provide connectors for other peripherals. The board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, other considerations, or a combination thereof. Other components, such as external storage, sensors, controllers for audio/video display, and peripheral devices may be attached to the board as plug-in cards, via cables, or integrated into the board itself.

In various implementations, receivers (for example, receiver 10, receiver 100, and receiver 400) and delta-sigma modulators (for example, delta-sigma modulator 200 and delta-sigma modulator 300), and/or the various circuits and/or components of the FIGURES can be implemented as stand-alone modules (for example, a device with associated components and circuitry configured to perform a specific application or function) or implemented as plug-in modules into application specific hardware of electronic devices. Note that particular embodiments of the present disclosure may be readily included in a system-on-chip (SOC) package, either in part, or in whole. An SOC represents an integrated circuit that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the various functions described herein may be implemented in one or more semiconductor cores (such as silicon cores) in application specific integrated circuits (ASICs), field programmable gate arrays (FPGAs), other semiconductor chips, or combinations thereof.

Note that the activities discussed above with reference to the FIGURES are applicable to any integrated circuits that involve signal processing, particularly those that can execute specialized software programs or algorithms, some of which may be associated with processing digitized real-time data. Certain embodiments can relate to multi-DSP signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems. Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc. In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

The specifications, dimensions, and relationships outlined herein have only been offered for purposes of example and teaching only. Each of these may be varied considerably without departing from the spirit of the present disclosure, or the scope of the appended claims. The specifications apply only to non-limiting examples and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than a restrictive sense. Further the various circuitry configurations described above can be replaced, substituted, or otherwise modified to accommodate various design implementations that achieve the lock detection mechanisms described herein. Moreover, using complementary electronic devices, hardware, software, etc. can offer an equally viable option for implementing the teachings of the present disclosure.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, circuits, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Further, note that references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is further noted that "coupled to" and "coupled with" are used interchangeably herein, and that references to a feature "coupled to" or "coupled with" another feature include any communicative coupling means, electrical coupling means, mechanical coupling means, other coupling means, or a combination thereof that facilitates the feature functionalities and operations, such as the detection mechanisms, described herein.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "steps for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

In various implementations, a system is provided that can be part of any type of computer, which can further include a circuit board coupled to a plurality of electronic components. The system can include means for sensing an electromagnetic field; generating an analog signal representing the electromagnetic field; and converting the analog signal to a digital signal. In various implementations, the means for sensing, generating, and converting can include a delta-sigma modulator. The 'means for' can also or alternatively include (but is not limited to) using any suitable component discussed herein, along with any suitable software, circuitry, hub, computer code, logic, algorithms, hardware, controller, interface, link, bus, communication pathway, etc. In various implementations, the system includes memory that includes instructions that when executed cause the system to perform any of the activities discussed herein. In various implementations, the various functions outlined herein may be implemented by logic encoded in one or more non-transitory and/or tangible media (for example, embedded logic provided in an application specific integrated circuit (ASIC), as digital signal processor (DSP) instructions, software (potentially inclusive of object code and source code) to be executed by a processor, or other similar machine, etc.).

What is claimed is:

1. A circuit comprising:
a delta-sigma modulator that is configured to sense and convert an electromagnetic field into a digital signal, wherein the delta-sigma modulator includes an LC resonator configured to sense the electromagnetic field and generate an analog signal, the delta-sigma modulator configured to convert the analog signal to the digital signal.

2. The circuit of claim 1, wherein an inductor of the LC resonator is configured to sense a magnetic field, such that a current induced by the sensed magnetic field provides the analog signal.

3. The circuit of claim 1, wherein a capacitor of the LC resonator is configured to sense an electric field, such that a voltage induced by the sensed electric field provides the analog signal.

4. The circuit of claim 1, wherein the delta-sigma modulator further includes an analog-to-digital converter coupled to the LC resonator, the analog-to-digital converter configured to convert the analog signal to the digital signal.

5. The circuit of claim 4, wherein the delta-sigma modulator further includes a digital-to-analog converter coupled to the LC resonator and the analog-to-digital converter, such that the digital-to-analog converter is configured to receive the digital signal from the analog-to-digital converter and generate a feedback analog signal, wherein the LC resonator is configured to receive the feedback analog signal.

6. The circuit of claim 1, wherein the delta-sigma modulator directly converts the electromagnetic field into the digital signal.

7. The circuit of claim 1, wherein the LC resonator is a first stage resonator of a plurality of resonators of the delta-sigma modulator.

8. The circuit of claim 1, wherein the delta-sigma modulator is a band-pass delta-sigma modulator.

9. The circuit of claim 1 further comprising a digital filter/decimator component coupled to the delta-sigma modulator, wherein the delta-sigma modulator and the digital filter/decimator component form a delta-sigma analog-to-digital converter.

10. The circuit of claim 9 further comprising a digital signal processor coupled to the delta-sigma analog-to-digital converter.

11. A delta-sigma modulator configured to generate an output signal that is a digital representation of an input signal, the delta-sigma modulator comprising:
a resonator configured to sense an electromagnetic field and generate the input signal for the delta-sigma modulator;
an analog-to-digital converter (ADC) coupled to the resonator, the ADC configured to receive the input signal and generate the output signal; and
a digital-to-analog converter (DAC) coupled to the resonator and the ADC, the DAC configured to receive the output signal from the ADC and generate a feedback input signal.

12. The delta-sigma modulator of claim 11, wherein the resonator is an LC resonator.

13. The delta-sigma modulator of claim 12, wherein the LC resonator includes an inductor and a capacitor connected in parallel.

14. The delta-sigma modulator of claim 12, wherein the LC resonator is configured as an inductive sensor, such that an inductor of the LC resonator senses a magnetic field and a current induced by the sensed magnetic field provides the input signal.

15. The delta-sigma modulator of claim 12, wherein the LC resonator is configured as a capacitive sensor, such that a capacitor of the LC resonator senses an electric field and a voltage induced by the sensed electric field provides the input signal.

16. The delta-sigma modulator of claim 11 further comprising a buffer coupled with the resonator and the ADC.

17. The delta-sigma modulator of claim 11, wherein the resonator is a first stage resonator of a plurality of resonators of the delta-sigma modulator.

18. The delta-sigma modulator of claim 11, wherein the input signal is an analog signal and the output signal is a digital signal.

19. A method comprising:

sensing, by a resonator of a delta-sigma modulator, an electromagnetic field;

generating, by the delta-sigma modulator, an analog signal representing the electromagnetic field; and converting, by the delta-sigma modulator, the analog signal to a digital signal.

20. The method of claim 19, wherein:

the delta-sigma modulator includes a resonator for sensing the electromagnetic field and generating the analog signal, wherein the generating the analog signal includes inducing a current or a voltage in the resonator upon the resonator sensing the electromagnetic field.

* * * * *